United States Patent
Doi

(10) Patent No.: US 6,773,992 B2
(45) Date of Patent: Aug. 10, 2004

(54) METHOD FOR FABRICATING NONVOLATILE-SEMICONDUCTOR MEMORY DEVICE

(75) Inventor: Hiroyuki Doi, Uji (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/119,827

(22) Filed: Apr. 11, 2002

(65) Prior Publication Data
US 2003/0036234 A1 Feb. 20, 2003

(30) Foreign Application Priority Data

Aug. 20, 2001 (JP) ........................................ 2001-248719

(51) Int. Cl.[7] .......................................... H01L 21/336
(52) U.S. Cl. ........................ 438/266; 438/258; 438/264; 438/275
(58) Field of Search ................................ 438/266, 264, 438/258, 241, 275, 223, 224, 227, 228, 257

(56) References Cited

U.S. PATENT DOCUMENTS

| | | | | |
|---|---|---|---|---|
| 5,158,902 A | * | 10/1992 | Hanada | ..................... 438/257 |
| 5,223,451 A | * | 6/1993 | Uemura et al. | ............. 257/314 |
| 5,407,853 A | * | 4/1995 | Komori et al. | ............. 438/258 |
| 5,712,178 A | * | 1/1998 | Cho et al. | ................... 438/257 |
| 5,911,105 A | * | 6/1999 | Sasaki | ........................ 438/258 |
| 5,937,286 A | * | 8/1999 | Abiko | ........................ 438/218 |
| 6,124,157 A | * | 9/2000 | Rahim | ........................ 438/257 |
| 6,297,133 B1 | * | 10/2001 | Chen et al. | ................. 438/228 |
| 6,410,387 B1 | * | 6/2002 | Cappelletti et al. | ......... 438/257 |
| 6,448,137 B1 | * | 9/2002 | Lai et al. | ..................... 438/258 |

FOREIGN PATENT DOCUMENTS

JP        08-017949        1/1996

* cited by examiner

Primary Examiner—Michael Trinh
(74) Attorney, Agent, or Firm—McDermott, Will & Emery

(57) ABSTRACT

A method for fabricating a nonvolatile semiconductor memory device according to the present invention includes patterning an insulating film for forming a tunnel insulating film and a conductor film for forming a floating gate electrode and forming a well region of a first conductivity type in the logic circuit portion of a semiconductor substrate. This prevents the well region in the logic circuit portion from experiencing a thermal budget resulting from the formation of the insulating film and the conductor film.

14 Claims, 11 Drawing Sheets

METHOD FOR FABRICATING NONVOLATILE-SEMICONDUCTOR MEMORY DEVICE

BACKGROUND OF THE INVENTION

The present invention relates to an erasable nonvolatile semiconductor memory device such as an EPROM device, an EEPROM device, or a flash memory device. More particularly, it relates to a method for fabricating a nonvolatile semiconductor memory device having a logic circuit portion, including a peripheral circuit and the like, merged therein.

A description will be given herein below to a conventional method for fabricating a nonvolatile semiconductor memory device with reference to the drawings.

FIGS. 9A, 9B, 9C, 10A, 10B, 10C, 11A, and 11B show cross-sectional structures of a nonvolatile semiconductor memory device in the individual process steps of the conventional fabrication method therefor.

First, as shown in FIG. 9A, dielectric isolation films 102 are formed in a semiconductor substrate 101 made of P-type silicon and having a memory circuit portion 1B and a logic circuit portion 2B composing a peripheral circuit for the memory circuit portion 1B. Then, a protective insulating film 103 with a thickness of about 20 nm is formed over the entire surface of the semiconductor substrate 101.

Subsequently, a first resist pattern 201 having an opening corresponding to the memory circuit portion 1B of the semiconductor substrate 101 and to the region of the logic circuit portion 2B of the semiconductor substrate 101 to be formed with an N-type MOS transistor is formed on the protective insulating film 103. By using the first resist pattern 201 as a mask, boron ions are implanted into the semiconductor substrate 101 so that a first P-well 104 is formed.

Next, as shown in FIG. 9B, a second resist pattern 202 having an opening corresponding to the N-type MOS transistor formation region of the logic circuit portion 2B is formed on the protective insulating film 103. By using the second resist pattern 202 as a mask, boron ions are implanted for threshold voltage control so that a second P-well 105 is formed in the N-type MOS transistor formation region of the logic circuit portion 2B. Thus, the second P-well 105 is formed by two steps of boron ion implantation.

Next, as shown in FIG. 9C, a third resist pattern 203 having an opening corresponding to the region of the logic circuit portion 2B to be formed with a P-type MOS transistor is formed on the protective insulating film 103. By using the third resist pattern 203 as a mask, phosphorus ions are implanted into the semiconductor substrate 101 so that an N-well 106 is formed in the P-type MOS transistor formation region of the logic circuit portion 2B.

Next, as shown in FIG. 10A, the protective insulating film 103 is removed. Then, a first insulating film 107 with a thickness of about 10 nm, a first polysilicon film 108, and a second insulating film 109 composed of a multilayer structure of a silicon dioxide and a silicon nitride are grown successively on the semiconductor substrate 101.

Next, as shown in FIG. 10B, a fourth resist pattern 204 having an opening corresponding to the logic circuit portion 2B is formed on the second insulating film 109. By using the fourth resist pattern 204 as a mask, etching is performed sequentially with respect to the second insulating film 109, the first polysilicon film 108, and the first insulating film 107, thereby exposing the logic circuit portion 1B of the semiconductor substrate 101.

Next, as shown in FIG. 10C, the fourth resist pattern 204 is removed. Then, a third insulating film 110 and a second polysilicon film 111 are grown successively over the second insulating film 109 in the memory circuit portion 1B and the semiconductor substrate 101 in the logic circuit portion 2B.

Next, as shown in FIG. 11A, a fifth resist pattern 205 including a pattern for forming a gate electrode structure in the memory circuit portion 1B is formed on the second polysilicon film 111. By using the fifth resist pattern 205, the films grown successively on the semiconductor substrate 101 are patterned into the gate electrode structure. Specifically, a tunnel insulating film 107a is formed from the first insulating film 107, a floating fate 108a is formed from the first polysilicon film 108, a capacitance insulating film 112 is formed from the second and third insulating films 109 and 110, and a control gate 111a is formed from the second polysilicon film 111.

Next, as shown in FIG. 11B, the fifth resist pattern 205 is removed. Then, a sixth resist pattern 206 including a pattern for forming a gate electrode in the logic circuit portion 2B is formed on the second polysilicon film 111 covering the logic circuit portion 2B. By using the sixth resist pattern 206 as a mask, etching is performed sequentially with respect to the second polysilicon film 111 and the third insulating film 110, thereby forming a gate electrode 111b from the second polysilicon film 111 and forming a gate insulating film 110b from the third insulating film 110.

Thus, the conventional method for fabricating a nonvolatile semiconductor memory device has performed the implantation of boron ions into the N-type MOS transistor formation region of the logic circuit portion 2B simultaneously with the formation of the first P-well 104. Then, a thermal oxidation process at a temperature of about 850° C. to 950° C. is normally performed during the formation of the first insulating film 107 for forming the tunnel insulating film 107a shown in FIG. 10A. The formation of the first polysilicon film 111 for forming the floating gate 108a employs a low-pressure CVD process which requires a heating temperature of about 600° C. to 700° C.

Due to the thermal budget, an impurity concentration profile is diffused in the first P-well 104, in the second P-well 105, and in the N-well 106 so that the problems of a degraded dielectric isolation property and an increased drain-junction capacitance occur. In particular, a MOS transistor contained in the logic circuit portion 2B is required to have an excellent dielectric isolation property and a high drain-junction breakdown voltage so that it is seriously affected by the diffused impurity concentration profile in the wells 104, 105, and 106. If the MOS transistor is required to be further miniaturized, influence not only on the dielectric isolation property but also on a short-channel effect cannot be ignored.

As recent CMOS fabrication processes have been performed at lower temperatures, ion implantation with a high acceleration energy has been used more frequently to form each of the wells 105 and 106. If such ion implantation with a high acceleration energy is performed, a contaminant containing heavy metal and the like are likely to enter the semiconductor substrate 101 so that the problem of the degraded gate insulating film 110B also occurs.

To prevent the contaminant from entering the semiconductor substrate 101, the protective insulating film 103 is formed normally on the surface of the semiconductor substrate 101, as shown in FIG. 9A. However, the protective insulating film 103 has its upper portion graded during the removal of each of the resist patterns 201, 202, and 203 and the thickness thereof is gradually reduced. Consequently, the protective insulating film 103 cannot sufficiently perform the function of protecting the semiconductor substrate 101. These problems are increasingly aggravated as elements are further miniaturized to an extent that they cannot be cancelled out any more merely by reducing the number of process steps and cost.

SUMMARY OF THE INVENTION

It is therefore a first object of the present invention to solve the foregoing conventional problems and prevent, in a semiconductor device having a memory circuit portion and a logic circuit portion merged therein, a thermal budget resulting from process steps for fabricating the memory circuit portion from affecting the well regions of the logic circuit portion. A second object of the present invention is to prevent a contaminant from entering a substrate during ion implantation for forming the well regions.

To attain the first object, the present invention provides a method for forming a nonvolatile semiconductor device, the method comprising: a first step of selectively forming a first well region of a first conductivity type in a memory circuit portion of a semiconductor substrate having the memory circuit portion and a logic circuit portion; a second step of successively forming a first insulating film and a first conductor film over the memory circuit portion and the logic circuit portion of the semiconductor substrate; a third step of patterning the first insulating film and the first conductor film so as to leave respective regions of the first insulating film and the first conductor film contained in the memory circuit portion; a fourth step of selectively forming a second well region of the first conductivity type in the logic circuit portion of the semiconductor substrate; a fifth step of successively forming a second insulating film and a second conductor film over the first conductor film in the memory circuit portion and the second well region in the logic circuit portion; a sixth step of successively patterning the second conductor film, the second insulating film, the first conductor film, and the first insulating film contained in the memory circuit portion to form a control gate electrode from the second conductor film, form a capacitance insulating film from the second insulating film, form a floating gate electrode from the first conductor film, and form a tunnel insulating film from the first insulating film; and a seventh step of patterning respective regions of the second conductor film and the second insulating film contained in the logic circuit portion to form a gate electrode from the second conductor film and form a gate insulating film from the second insulating film.

In accordance with the method for fabricating a nonvolatile semiconductor memory device of the present invention, the second well region of the first conductivity type is formed in the logic circuit portion of the semiconductor substrate after the first insulating film for forming the tunnel insulating film and the first conductor film for forming the floating gate electrode are patterned. Consequently, the second well region in the logic circuit portion does not experience the thermal budget resulting from the formation of the first insulating film and the first conductor film. This prevents the degradation of a dielectric isolating property and an increase in drain-junction capacitance.

In the method for fabricating a nonvolatile semiconductor device of the present invention, the third step preferably includes etching a region of the first insulating film contained in the logic circuit portion such that a lower portion thereof is left to cover the logic circuit portion and thereby forming a partial film composed of the first insulating film and the fourth step preferably includes implanting ions into the logic circuit portion through the partial film. The second object is also achievable with the arrangement. Since the ion implantation is performed with respect to the logic circuit portion through the partial film composed of a lower portion of the first insulating film contained in the logic circuit portion during the formation of the second well region in the logic circuit portion, the entrance of a contaminant composed of heavy metal and the like into the semiconductor substrate due to an increased acceleration energy can be prevented.

Preferably, the method for fabricating a nonvolatile semiconductor device of the present invention further comprises, prior to the first step, the step of forming a protective insulating film over the entire surface of the semiconductor substrate, wherein the first step preferably includes forming the first well region by implanting ions through the protective insulating film and removing a region of the protective insulating film contained in the memory circuit portion, the second step preferably includes forming the first insulating film on the protective insulating film, the third step preferably includes performing the patterning so as to leave a region of the protective insulating film contained in the logic circuit portion, and the fourth step preferably includes implanting ions into the logic circuit portion through the protective insulating film.

The second object is also achievable with the arrangement. Since the ion implantation is performed with respect to the logic circuit portion with the protective insulating film being left on the logic circuit portion of the semiconductor substrate during the formation of the second well region in the logic circuit portion, the entrance of a contaminant into the semiconductor substrate due to an increased acceleration energy can be prevented.

In the method for fabricating a nonvolatile semiconductor device of the present invention, the third step preferably includes etching a region of the first insulating film contained in the logic circuit portion such that a lower portion thereof is left to cover the logic circuit portion and thereby forming a partial film composed of the first insulating film and the fourth step preferably includes forming the second well region by implanting ions into the logic circuit portion through the partial film and the protective insulating film. The arrangement more positively prevents a contaminant from entering the semiconductor substrate.

In the method for fabricating a nonvolatile semiconductor device of the present invention, the fourth step preferably includes selectively forming a third well region of a second conductivity type in the logic circuit portion of the semiconductor substrate. The arrangement allows the formation of a CMOS circuit in the logic circuit portion and prevents the third well region from experiencing the thermal budget resulting from the formation of the first insulating film and the first conductor film on the memory circuit portion.

Preferably, the method for fabricating a nonvolatile semiconductor device of the present invention further comprises, between the first and second steps, the step of: implanting impurity ions of a second conductivity type into the semiconductor substrate to form a fourth well region of the second conductivity type under the first well region. The arrangement provides the first well region composed of a multi-well structure, while using the mask pattern for forming the first well region without any alterations.

In the method for fabricating a nonvolatile semiconductor device of the present invention, the step of forming the fourth well region preferably includes implanting impurity ions of the first conductivity type and impurity ions of the second conductivity type and a projected range of the impurity ions of the second conductivity type is preferably larger than a projected range of the impurity ions of the first conductivity type.

Preferably, the method for fabricating a nonvolatile semiconductor device of the present invention further comprises, between the second and third steps, the step of: forming a third insulating film containing a nitride on the region of the first conductor film contained in the memory circuit portion, the third step includes performing the patterning so as to leave a region of the third insulating film contained in the memory circuit portion, wherein the fifth step includes forming the second insulating film on the third insulating film, and the sixth step includes forming the capacitance insulating film from the second and third insulating films. The arrangement provides the capacitance insulating film composed of a silicon oxynitride, preferably an ONO film, between the floating gate electrode and the control gate electrode.

DETAILED DESCRIPTION OF THE INVENTION

Embodiment 1

Figure 1A:
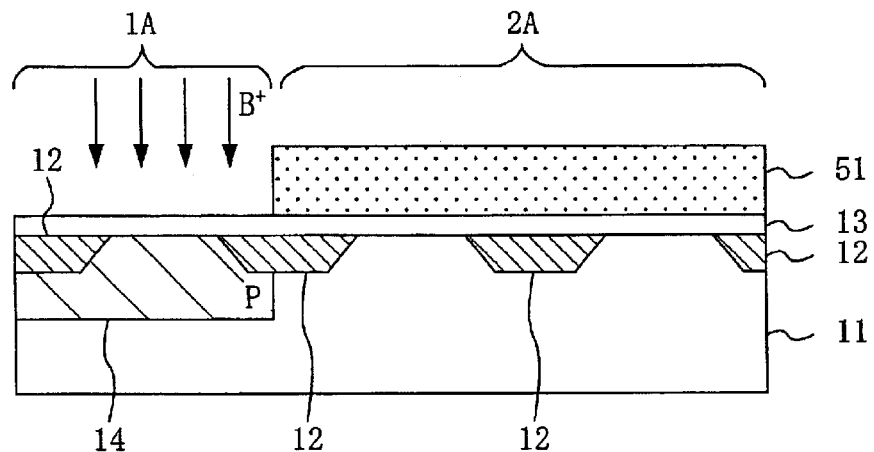
FIGS. 1A, 1B, and 1C are cross-sectional views illustrating the individual process steps of a method for fabricating a nonvolatile semiconductor memory device according to a first embodiment of the present invention.

Referring to the drawings, a first embodiment of the present invention will be described.

FIGS. 1A, 1B, 1C, 2A, 2B, 2C, 3A, and 3B show cross-sectional structures of a nonvolatile semiconductor memory device according to the first embodiment in the individual process steps of a fabrication method therefor.

First, as shown in FIG. 1A, dielectric isolation films 12 composed of trench isolations or the like are formed in a semiconductor substrate 11 made of p-type silicon and having a memory circuit portion 1A and a logic circuit portion 2A composing a peripheral circuit for the memory circuit portion 1A. Then, a silicon dioxide with a thickness of about 20 nm is grown by thermal oxidation or CVD on the entire surface of the semiconductor substrate 11 to form a protective insulating film 13 for protecting the semiconductor substrate 11. Subsequently, a first resist pattern 51 having an opening corresponding to the memory circuit portion 11A of the semiconductor substrate 11 is formed by photolithography on the protective insulating film 13. By using the formed first resist pattern 51 as a mask, boron ($B^+$)ions with an acceleration energy of about 300 keV are implanted into the semiconductor substrate 11 through the protective insulating film 13, whereby a first P-well 14 is formed in the memory circuit portion 1A of the semiconductor substrate 11.

Figure 1B:
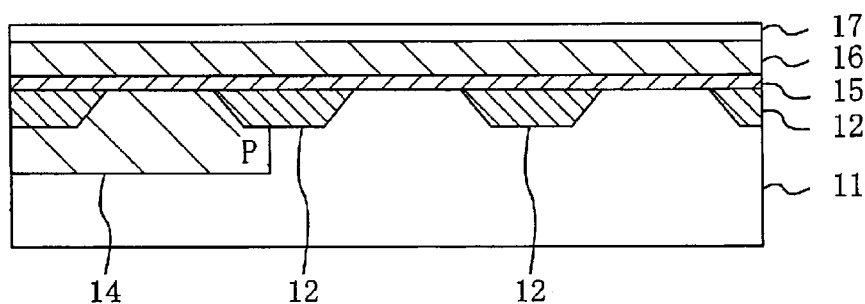

Next, as shown in FIG. 1B, the first resist pattern 51 is removed and then the protective insulating film 13 is removed by using an etching gas containing fluorocarbon and the like. Thereafter, a first insulating film 15 with a thickness of about 10 nm is formed by thermal oxidation over the entire surface of the semiconductor substrate 11. Subsequently, a first conductor film 16 made of polysilicon and a lower capacitance insulating film 17 as a third insulating film which is a so-called ONO film composed of a multilayer structure of a silicon dioxide layer and a silicon nitride layer are deposited successively by low-pressure CVD on the first insulating film 15.

Figure 1C:
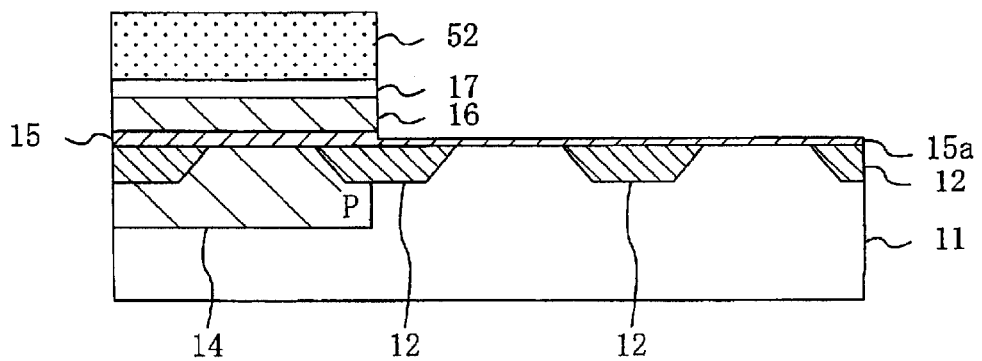

Next, as shown in FIG. 1C, a second resist pattern 52 having an opening corresponding to the logic circuit portion 2A is formed on the lower capacitance insulating film 17 by photolithography. By using the formed second resist pattern 52 as a mask, the lower capacitance insulating film 17 and the first conductor film 16 are patterned. Specifically, the lower capacitance insulating film 17 is etched by using an etching gas containing fluorocarbon and then the first conductor film 16 is removed by using an etching gas containing halogen, e.g., hydrogen chloride (HCL), chlorine ($Cl_2$), bromine (HBr), or the like. During the etching of the first conductor film 16, an upper portion of the region of the first insulating film 15 contained in the logic circuit portion 2A is etched so that a remaining film (partial film) 15a composed of the lower portion of the first insulating film 15 is formed.

Figure 2A:
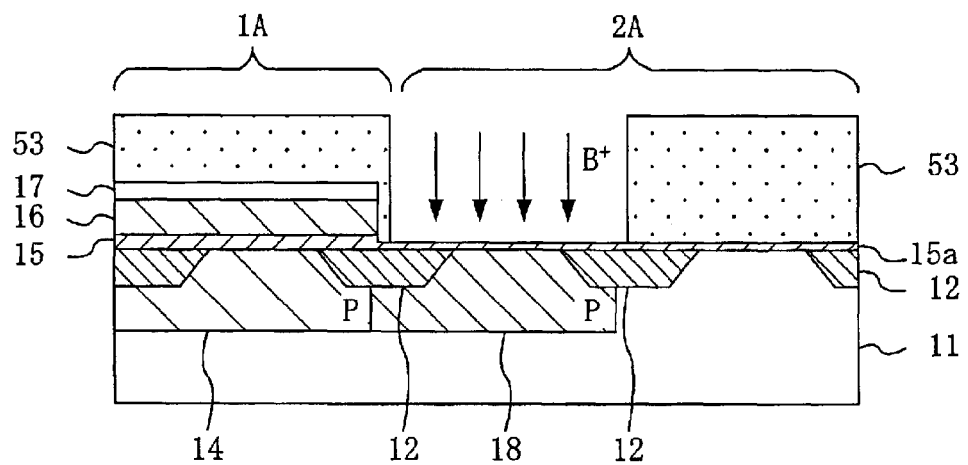
FIGS. 2A, 2B, and 2C are cross-sectional views illustrating the individual process steps of the method for fabricating a nonvolatile semiconductor memory device according to the first embodiment.

Next, as shown in FIG. 2A, the second resist pattern 52 is removed. Then, a third resist pattern 53 having an opening corresponding to the region of the logic circuit portion 2A to be formed with an N-type MOS transistor is formed. Subsequently, boron ($B^+$) ions are implanted through a remaining film 15a by using the third resist pattern 53 as a mask, whereby a second P-well 18 is formed in the N-type MOS transistor formation region of the logic circuit portion 2A of the semiconductor substrate 11.

Figure 2B:
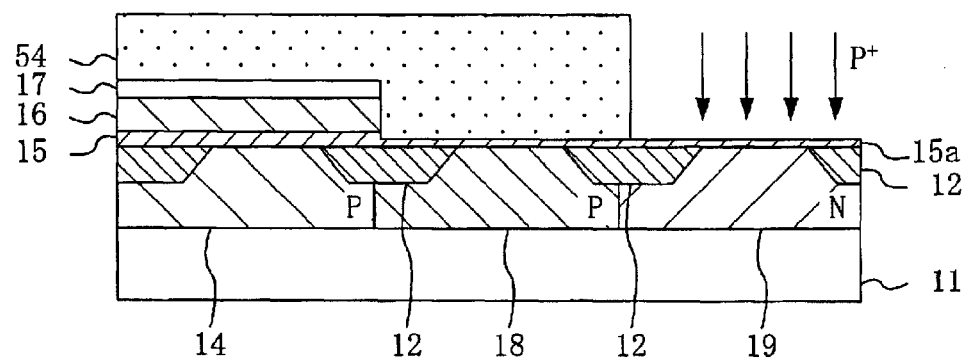

Next, as shown in FIG. 2B, the third resist pattern 53 is removed. Then, a fourth resist pattern 54 having an opening corresponding to the region of the logic circuit portion 2A to be formed with a P-type MOS transistor is formed. Subsequently, phosphorus (P$^+$) ions are implanted through the remaining film 15a by using the fourth resist pattern 54 as a mask, whereby an N-well 19 is formed in the P-type MOS transistor formation region of the logic circuit portion 2A of the semiconductor substrate 11.

Figure 2C:
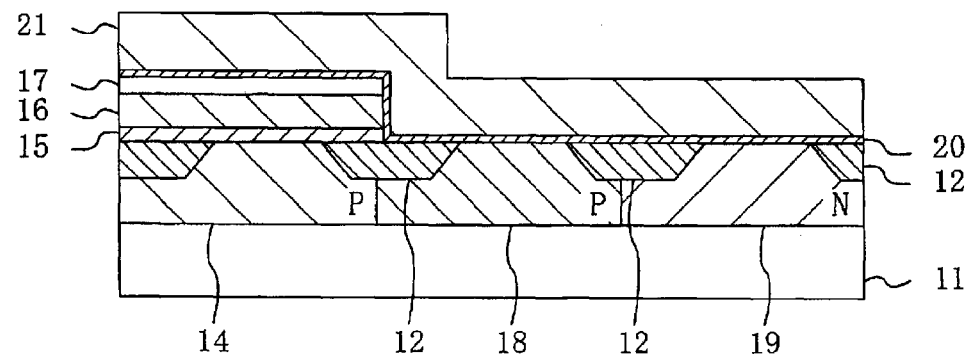

Next, as shown in FIG. 2C, the fourth resist pattern 54 is removed and then the remaining film 15a is removed by using a chemical such as a buffered hydrofluoric acid or the like as an etching material. Then, a second insulating film 20 composed of a silicon dioxide with a thickness of about 5 nm is formed by, e.g., thermal oxidation over the entire surface of the semiconductor substrate 11 including the lower capacitance insulating film 17 in the memory circuit portion 1A. Subsequently, a second conductor film 21 composed of polysilicon is deposited by low-pressure CVD on the second insulating film 20.

Figure 3A:
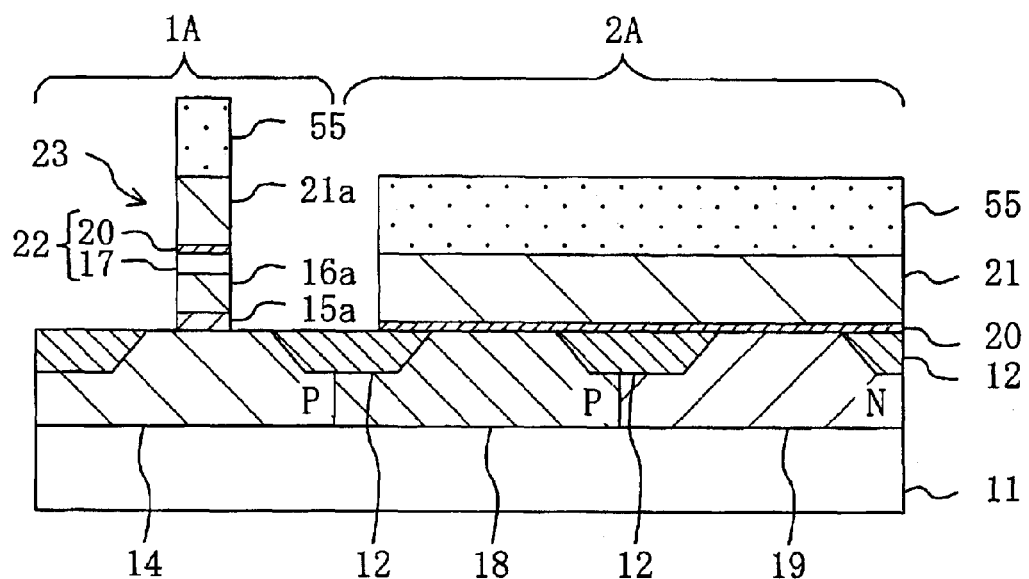
FIGS. 3A and 3B are cross-sectional views illustrating the individual process steps of the method for fabricating a nonvolatile semiconductor memory device according to the first embodiment.

Next, as shown in FIG. 3A, the films grown successively on the semiconductor substrate 11 are patterned into a gate electrode structure 23 contained in the memory circuit portion 1A. Specifically, a fifth resist pattern 55 including a pattern for forming the gate electrode structure 23 in the memory circuit portion 1A is formed on the second conductor film 21. By using the formed fifth resist pattern 55 as a mask, a control gate 21a is formed from the second conductor film 21, a capacitance insulating film 22 is formed from the second insulating film 20 and the lower capacitance insulating film 17, a floating gate 16a is formed from the first conductor film 16, and a tunnel insulating film 15a is formed from the first insulating film 15.

Figure 3B:
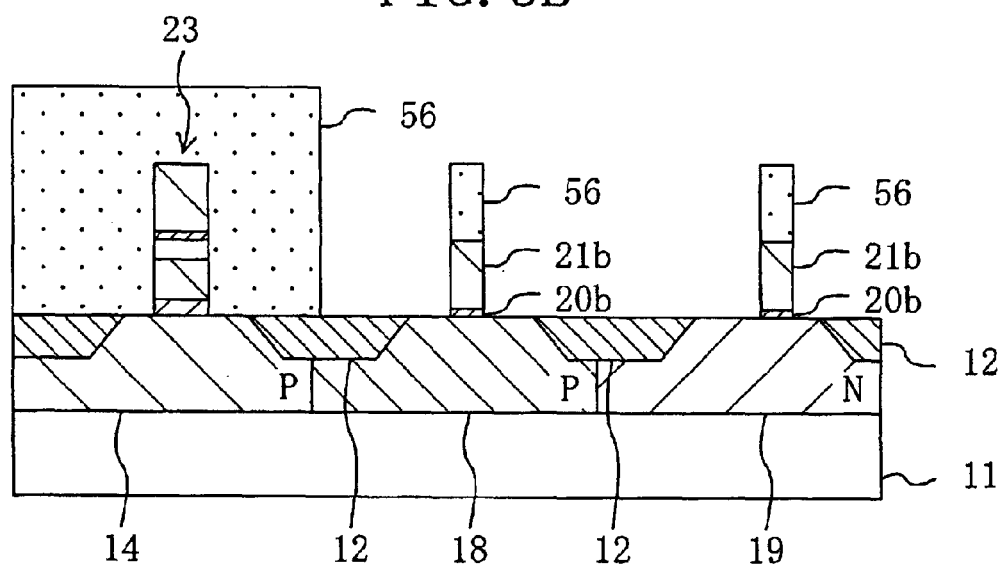

Next, as shown in FIG. 3B, the fifth resist pattern 55 is removed. Then, the second conductor film 21 and the second insulating film 20 each contained in the logic circuit portion 2A are patterned to form respective gate electrodes on the second P-well 18 and the N-well 19 in the semiconductor substrate 11. Specifically, a sixth resist pattern 56 including a pattern for forming the gate electrodes is formed on the second conductor film 21. By using the formed sixth resist pattern 56 as a mask, the respective gate electrodes 21b of the N-type MOS transistor and the P-type MOS transistor are formed from the second conductor film 21, while the respective gate insulating films 20b of the individual transistors are formed from the second insulating film 20.

Thereafter, the sixth resist pattern 56 is removed, specified source and drain diffusion layers are formed for the memory circuit portion 1A and the logic circuit portion 2A, and a metal wiring layer made of aluminum or the like are formed subsequently, though they are not depicted.

Thus, the first embodiment has formed the first insulating film 15 for forming the tunnel insulating film 15a and the first conductor film 16 and the lower capacitance insulating film 17 each for forming the floating gate electrode 16a in the step shown in FIG. 1B and then formed the second P-well 18 and the N-well 19 each contained in the logic circuit portion 2A in the steps shown in FIGS. 2A and 2B. Consequently, the second P-well 18 and the N-well 19 do not experience a thermal budget resulting from the formation of the first insulating film 15, the first conductor film 16, and the lower capacitance insulating film 17. This prevents the degradation of the dielectric isolation property of each of the second P-well 18 and the N-well 19 and an increase in drain-junction capacitance in the logic circuit portion 2A.

As a result, there can be implemented a process free from a shift in threshold voltage (Vt) and excellent in controllability. The process also has satisfactory compatibility with a process not containing a nonvolatile semiconductor memory element.

As shown in FIGS. 2A and 2B, the first embodiment has also performed the ion implantation for forming each of the wells 18 and 19 through the remaining film 15a composed of the lower portion of the first insulating film 15. This suppresses the entrance of a contaminant composed of heavy metal and the like into each of the wells 18 and 19.

The wells provided in the logic circuit portion 2A are not limited to the second P-well 18 and the N-well 19. It is also possible to form another P-well or another N-well having an impurity concentration profile different from those of the wells 18 and 19 in the other region of the memory circuit portion 2A.

An element formed on the first P-well 14 in the memory circuit portion 1A is not limited to the memory element. A transistor may also be formed thereon.

Variation of Embodiment 1

A variation of the first embodiment according to the present invention will be described with reference to the drawings.

Figure 4:
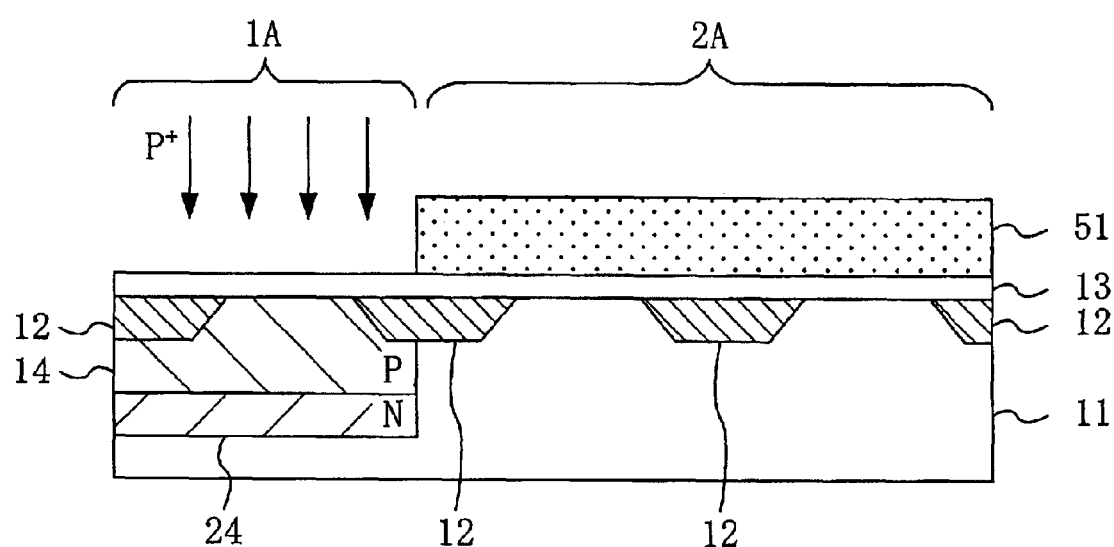
FIG. 4 is a cross-sectional view illustrating one process step of a method for fabricating a nonvolatile semiconductor memory device according to a variation of the first embodiment.
Figure 5:
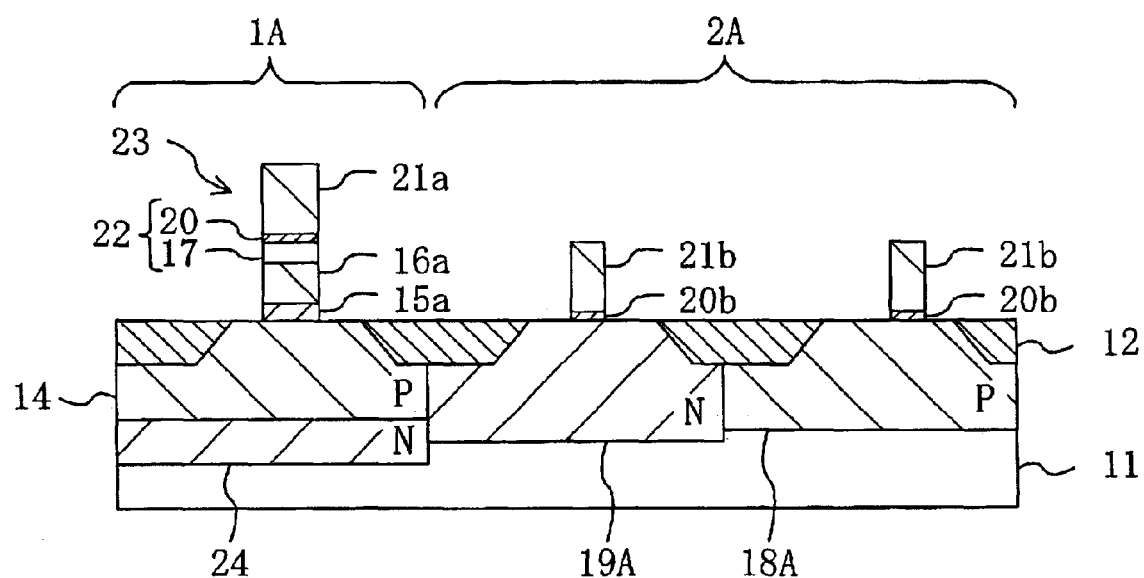
FIG. 5 is a cross-sectional view illustrating one process step of the method for fabricating a nonvolatile semiconductor memory device according to the variation of the first embodiment.

FIGS. 4 and 5 show cross-sectional structures of a non-volatile semiconductor memory device according to the variation of the first embodiment in the individual process steps of a fabrication method therefor, of which FIG. 4 shows an ion implantation step between the step shown in FIG. 1A and the step shown in FIG. 1B in the first embodiment and FIG. 5 shows the respective structures of the gate electrode structure 23 in the memory circuit portion 1A and the gate electrodes 21b in the logic circuit portion 2A. The components shown in FIGS. 4 and 5 which are the same as those shown in FIGS. 1A and 3B are designated by the same reference numerals.

First, as shown in FIG. 4, phosphorus (P$^+$) ions with an acceleration energy of about 1.5 MeV are implanted into the semiconductor substrate 11 through the protective insulating film 13 by using the first resist pattern 51 as a mask, whereby a deep N-well 24 is formed in the portion of the semiconductor substrate 11 underlying the first P-well 14 in the memory circuit portion 1A.

The deep N-well 24 is formed appropriately by implanting not only phosphorus ions as an N-type impurity but also boron ions as a P-type impurity with an acceleration energy lower than that used to implant the phosphorus ions. This prevents a reduction in p-type impurity concentration in the first P-well 14.

Thereafter, the first insulating film, the first conductor film, and the lower capacitance insulating film are deposited similarly to the first embodiment. The resulting multilayer structure is then patterned such that the region thereof contained in the memory circuit portion 1A is left. Then, as shown in FIG. 5, an N-well 19A is formed in the region of the logic circuit portion 2A closer to the memory circuit portion 1A such that the lower side end portion of the N-well 19A located on one side of the gate electrode is in contact with the deep well 24. On the other hand, a second P-well 18A is formed on the region of the logic circuit portion 2A opposite to the memory circuit portion 1A relative to the N-well 19A. Subsequently, the gate electrode structure 23 and each of the gate electrodes 21b are formed through patterning.

Thus, the present variation has formed the deep N-well 24 under the first P-well 14 contained in the memory circuit portion 1A and the N-well 19A in the region of the logic circuit portion 2A adjacent to the memory circuit portion 1A such that the lower side end portion of the N-well 19A is in contact with the deep well 24. In the arrangement, the first P-well 14 contained in the memory circuit portion 1A to which a voltage higher than that applied to the logic circuit portion 2A is applied constitutes a multi-well structure in conjunction with the deep N-well 24 so that the dielectric isolation property of the first P-well 14 is improved.

Since the first resist pattern 51 can be used without any alterations as a mask in forming the multi-well structure, i.e., in the step of implanting the N-type impurity ions shown in FIG. 4, the number of the steps for forming masks is not increased.

Embodiment 2

Referring to the drawings, a second embodiment of the present invention will be described.

FIGS. 6A, 6B, 6C, 7A, 7B, 7C, 8A, 8B, and 8C show cross-sectional structures of a nonvolatile semiconductor memory device according to second embodiment in the individual process steps of a fabrication method therefor.

Figure 6A:
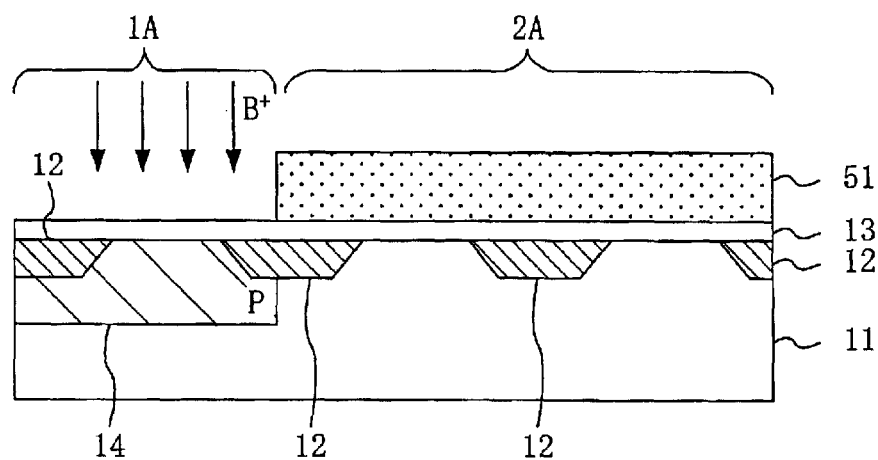
FIGS. 6A, 6B, and 6C are cross-sectional views illustrating the individual process steps of a method for fabricating a nonvolatile semiconductor memory device according to a second embodiment of the present invention.

First, as shown in FIG. 6A, dielectric isolation films 12 composed of trench isolations or the like are formed in a semiconductor substrate 11 made of p-type silicon and having a memory circuit portion 1A and a logic circuit portion 2A composing a peripheral circuit for the memory circuit portion 1A. Then, a protective insulating film 13 for the semiconductor substrate 11 is formed to a thickness of about 20 nm by thermal oxidation or CVD on the entire surface of the semiconductor substrate 11. Subsequently, a first resist pattern 51 having an opening corresponding to the memory circuit portion 11A of the semiconductor substrate 11 is formed by photolithography on the protective insulating film 13. By using the first resist pattern 51, boron ($B^+$) ions with an acceleration energy of about 300 keV are implanted into the semiconductor substrate 11 through the protective insulating film 13, whereby a first P-well 14 is formed in the region of the memory circuit portion 1A of the semiconductor substrate 11 to be formed with an N-type MOS transistor.

Figure 6B:
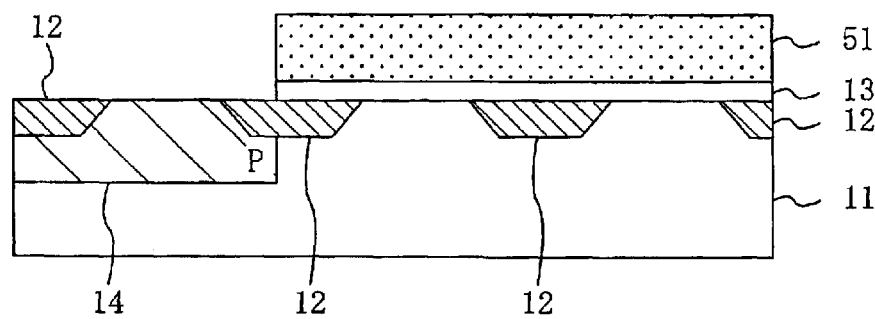

Next, as shown in FIG. 6B, the region of the protective insulating film 13 contained in the memory circuit portion 1A is removed by using the first resist pattern 51 as a mask.

Figure 6C:
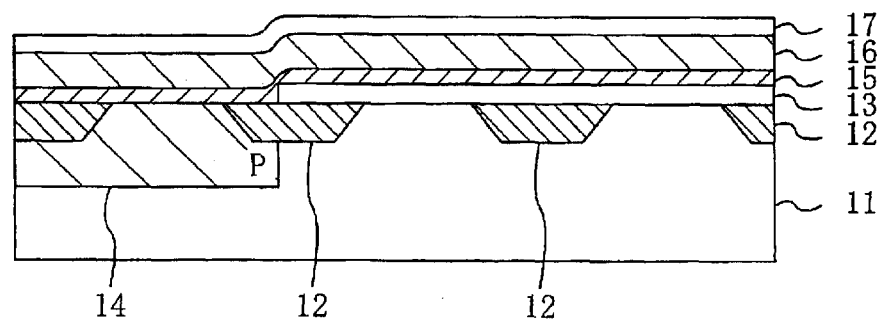

Next, as shown in FIG. 6C, the first resist pattern 51 is removed. Thereafter, a first insulating film 15 with a thickness of about 10 nm is formed by thermal oxidation over the entire surface of the semiconductor substrate 11 including the protective insulating film 13. Subsequently, a first conductor film 16 made of polysilicon and a lower capacitance insulating film 17 as a third insulating film which is an ONO film are deposited successively by low-pressure CVD on the first insulating film 15.

Figure 7A:
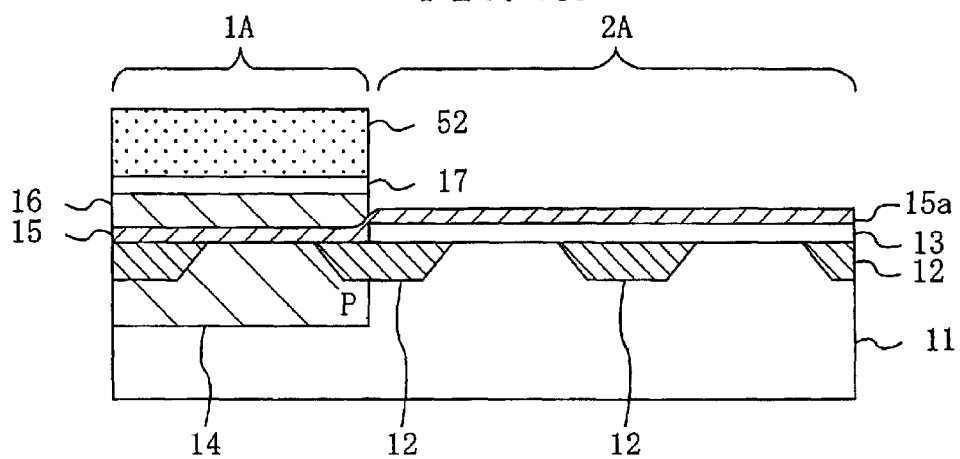
FIGS. 7A, 7B, and 7C are cross-sectional views illustrating the individual process steps of the method for fabricating a nonvolatile semiconductor memory device according to the second embodiment.

Next, as shown in FIG. 7A, a second resist pattern 52 having an opening corresponding to the logic circuit portion 2A is formed on the lower capacitance insulating film 17. By using the second resist pattern 52 as a mask, the lower capacitance insulating film 17 and the first conductor film 16 are patterned. Specifically, the lower capacitance insulating film 17 is etched by using an etching gas containing fluorocarbon and then the first conductor film 16 is removed by using an etching gas containing halogen, e.g., hydrogen chloride, chlorine, bromine, or the like. During the etching of the first conductor film 16, an upper portion of the region of the first insulating film 15 located on the protective insulating film 13 is etched so that a remaining film (partial film) 15a composed of the lower portion thereof is formed.

Figure 7B:
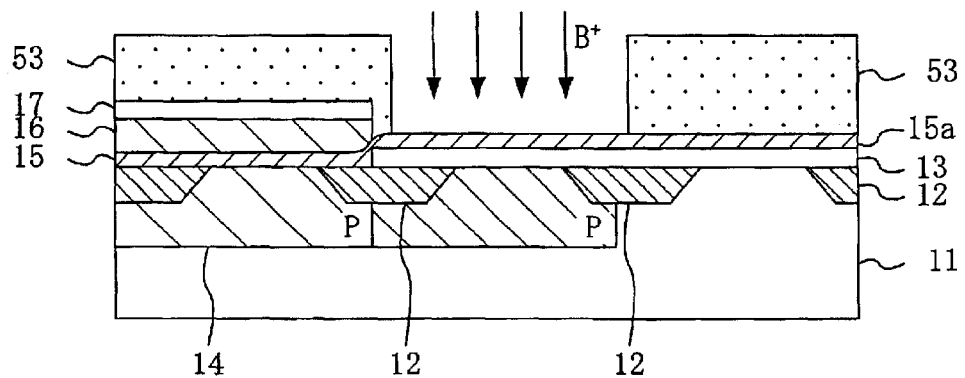

Next, as shown in FIG. 7B, the second resist pattern 52 is removed. Then, a third resist pattern 53 having an opening corresponding to the region of the logic circuit portion 2A to be formed with an N-type MOS transistor is formed. Subsequently, boron ($B^+$) ions are implanted through a remaining film 15a and the protective insulating film 13 by using the third resist pattern 53 as a mask, whereby a second P-well 18 is formed in the N-type MOS transistor formation region of the logic circuit portion 2A of the semiconductor substrate 11.

Figure 7C:
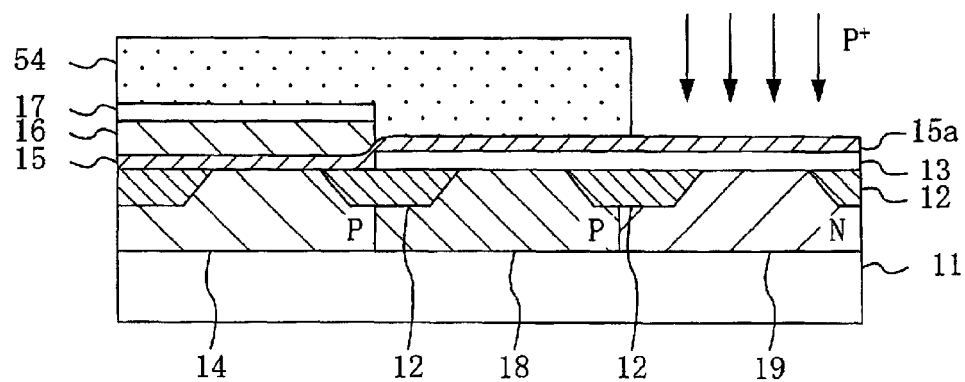

Next, as shown in FIG. 7C, the third resist pattern 53 is removed. Then, a fourth resist pattern 54 having an opening corresponding to the region of the logic circuit portion 2A to be formed with a P-type MOS transistor is formed. By using the fourth resist pattern 54 as a mask, phosphorus ($P^+$) ions are implanted through the remaining film 15a and the protective insulating film 13, whereby an N-well 19 is formed in the P-type MOS transistor formation region of the logic circuit portion 2A of the semiconductor substrate 11.

Figure 8A:
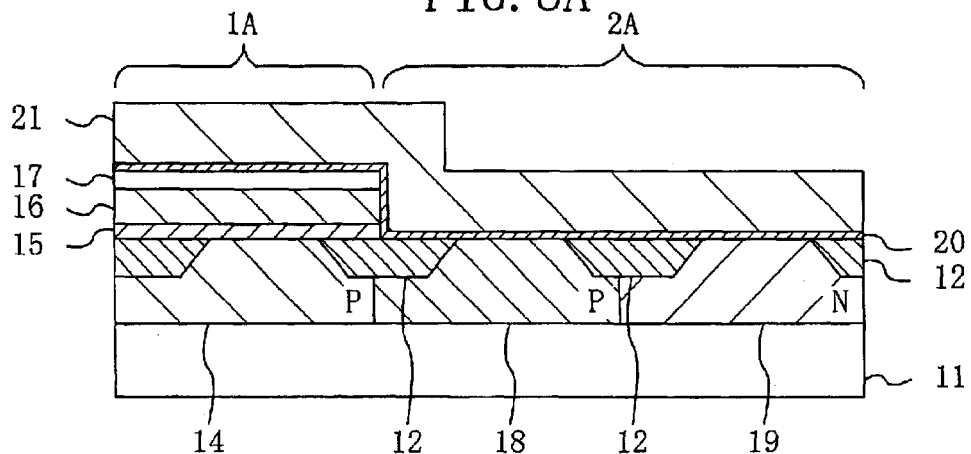
FIGS. 8A, 8B, and 8C are cross-sectional views illustrating the individual process steps of the method for fabricating a nonvolatile semiconductor memory device according to the second embodiment.

Next, as shown in FIG. 8A, the fourth resist pattern 54 is removed and then the remaining film 15a and the underlying protective insulating film 13 are removed selectively by using a chemical such as a buffered hydrofluoric acid or the like. Then, a second insulating film 20 composed of a silicon dioxide with a thickness of about 5 nm is formed by, e.g., thermal oxidation over the entire surface of the semiconductor substrate 11 including the lower capacitance insulating film 17 in the memory circuit portion 1A. Subsequently, a second conductor film 21 composed of polysilicon is deposited by low-pressure CVD on the second insulating film 20.

Figure 8B:
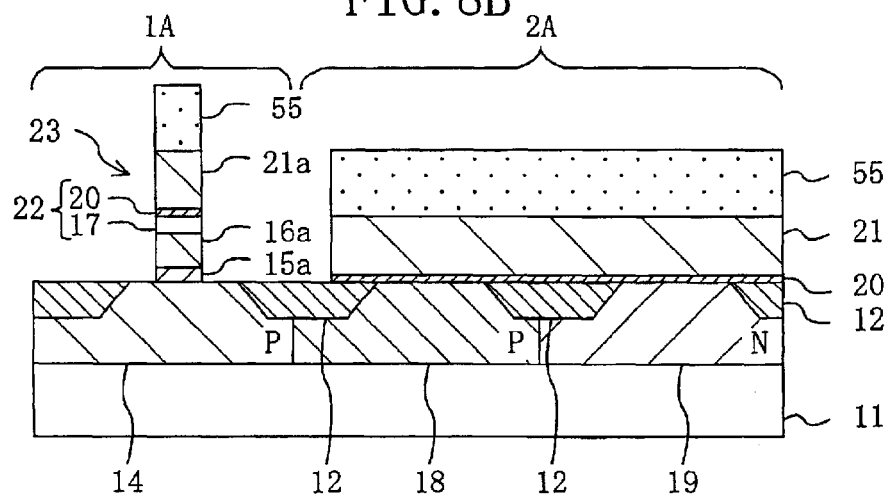

Next, as shown in FIG. 8B, a gate electrode structure 23 composed of a tunnel insulating film 15a, a floating gate 16a, a capacitance insulating film 22, and a control gate 21a is obtained in the memory circuit portion 1A, similarly to the first embodiment.

Figure 8C:
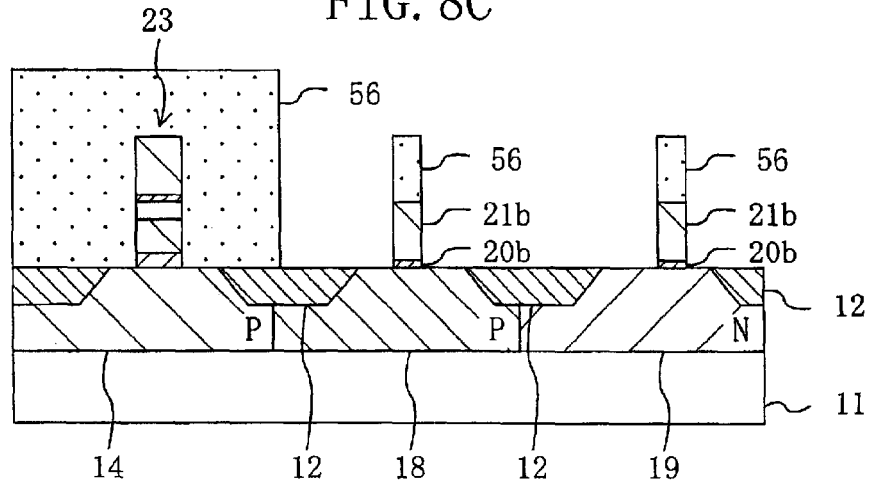
Figure 9A:
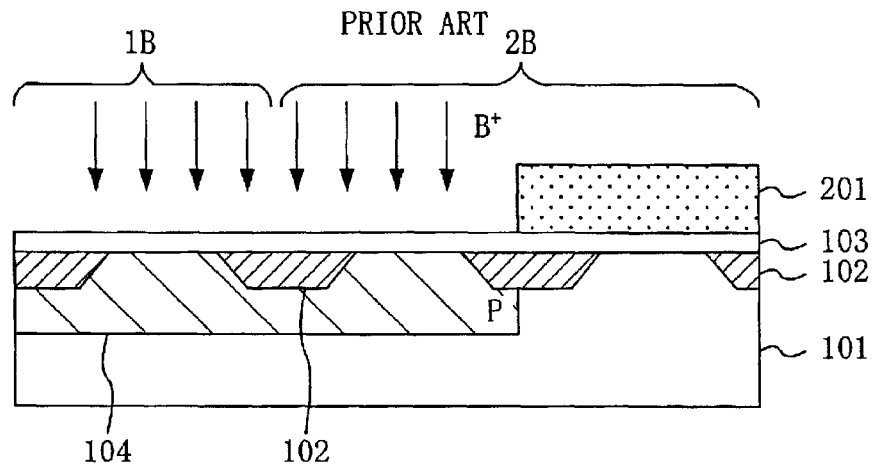
FIGS. 9A, 9B, and 9C are cross-sectional views illustrating the individual process steps of a conventional method for fabricating a nonvolatile semiconductor memory device.
Figure 9B:
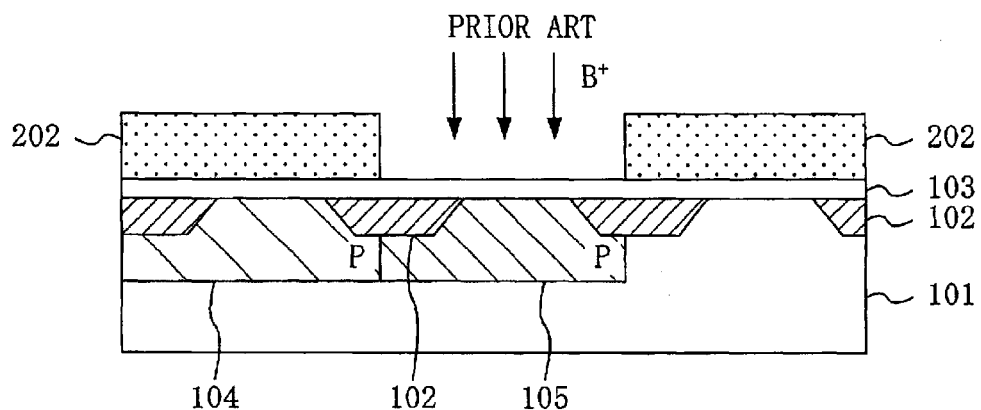
Figure 9C:
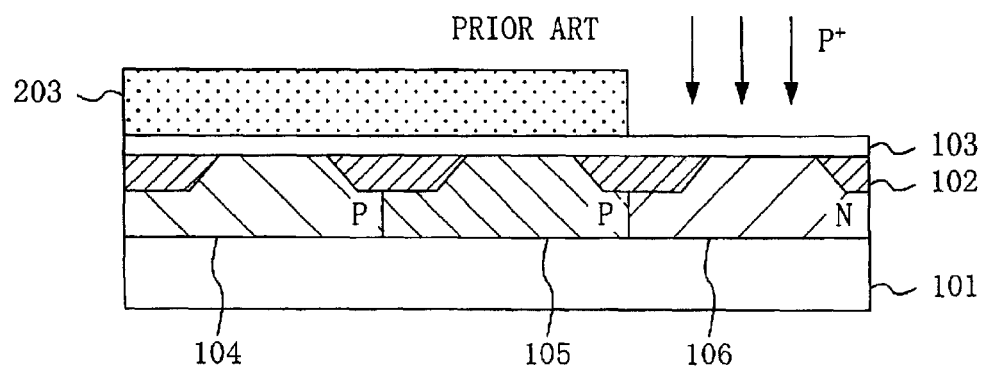
Figure 10A:
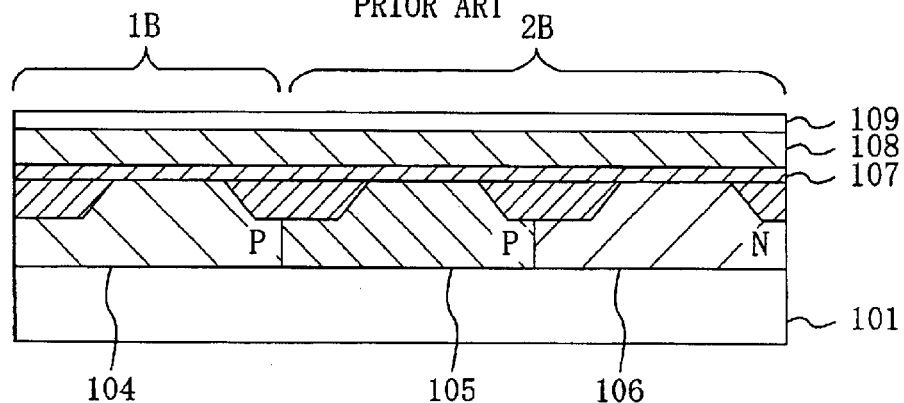
FIGS. 10A, 10B, and 10C are cross-sectional views illustrating the individual process steps of the conventional method for fabricating a nonvolatile semiconductor memory device.
Figure 10B:
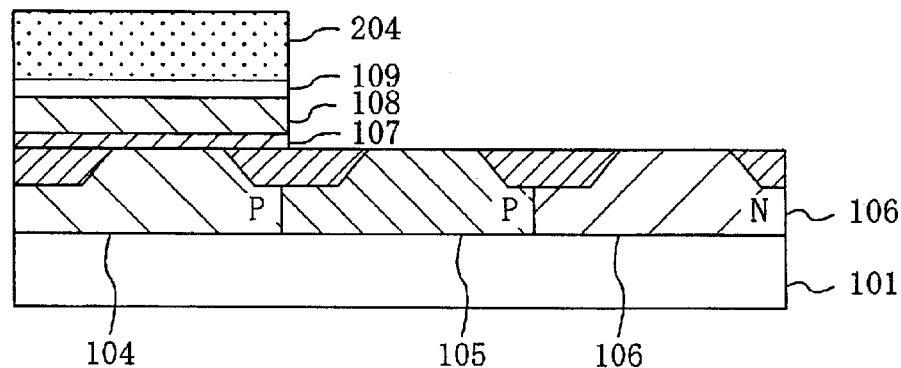
Figure 10C:
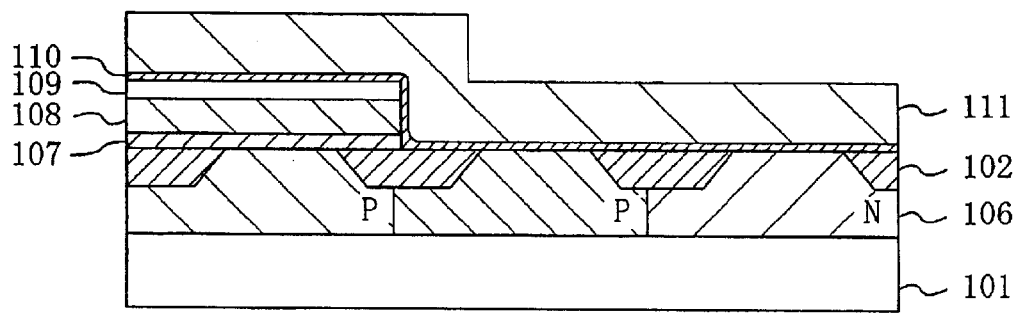
Figure 11A:
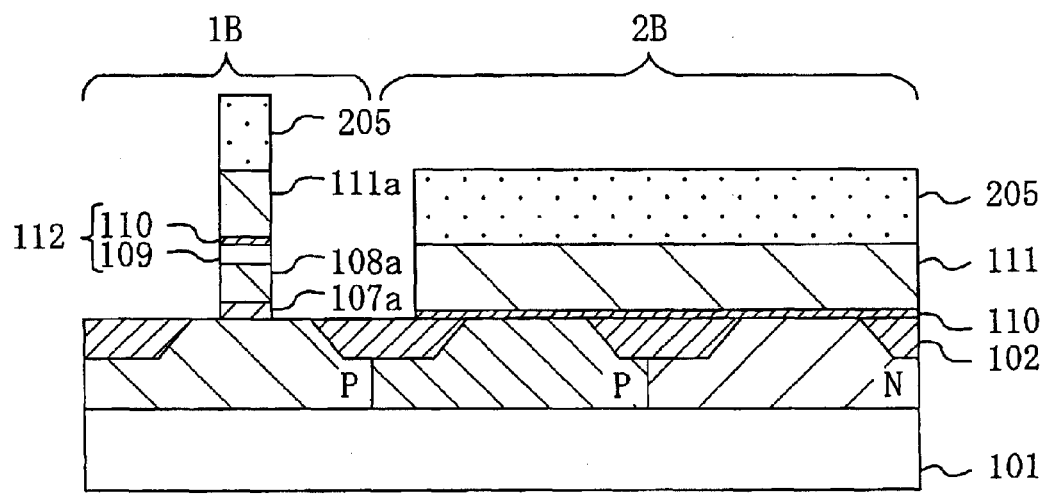
FIGS. 11A and 11B are cross-sectional views illustrating the individual process steps of the conventional method for fabricating a nonvolatile semiconductor memory device.
Figure 11B:
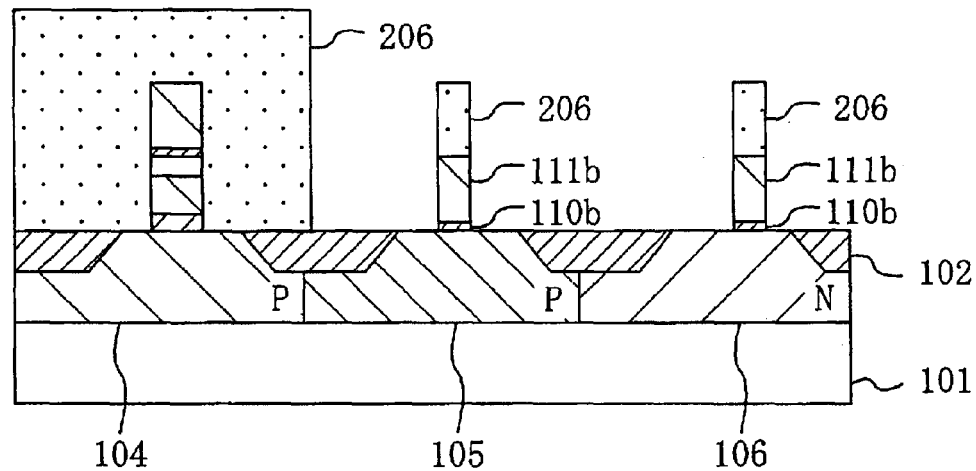

Next, as shown in FIG. 8C, a gate insulating film 20b and a gate electrode 21b are formed on the second P-well 18 and the N-well 19 in the semiconductor substrate 11, respectively.

Thereafter, the sixth resist pattern 56 is removed, specified source and drain diffusion layers are formed in the memory circuit portion 1A and the logic circuit portion 2A, and then a wiring layer is formed, though they are not depicted.

Thus, the second embodiment has formed the first insulating film 15, the first conductor film 16, and the lower capacitance insulating film 17 and then formed the second P-well 18 and the N-well 19 in the logic circuit portion 2A, similarly to the first embodiment. Consequently, the second P-well 18 and the N-well 19 do not experience a thermal budget resulting from the formation of the first insulating film 15, the first conductor film 16, and the lower capacitance insulating film 17. This prevents the degradation of the dielectric isolation property of each of the second P-well 18 and the N-well 19 and an increase in drain-junction capacitance in the logic circuit portion 2A.

As shown in FIGS. 7B and 7C, the second embodiment has also implanted ions through the remaining film 15a and the protective insulating film 13 in each of the ion implantation steps for forming the second P-well 18 and the N-well 19.

As stated previously, when ion implantation with a high acceleration energy is used, a contaminant containing heavy metal and the like is generally likely to enter the semiconductor substrate 11. To prevent the contaminant from entering the semiconductor substrate 11, the method for fabricating a nonvolatile semiconductor memory device according to each of the conventional and first embodiments has formed the protective insulating film with a thickness of about 20 nm.

However, it is only for the formation of the first P-well 14 that the first embodiment has performed the ion implantation through the protective insulating film 13. On the other hand, the first embodiment has used the remaining film 15a of the first insulating film 15 made of a silicon dioxide which remains after the etching of the first conductor film 16 made of polysilicon in the logic circuit portion 2A. The thickness of the first insulating film 15 for forming the tunnel insulating film 15a is normally on the order of 10 nm so that the thickness of the remaining film 15a is about 5 nm, though it depends on the etching selectivity of the first conductor film 16 to the first insulating film 15. It can therefore be said that the first embodiment cannot sufficiently achieve the effect of preventing the contaminant from entering the semiconductor substrate 11 by performing the ion implantation with a high acceleration energy only through the remaining film 15a during the formation of the second P-well 18 and the N-well 19.

By contrast, the second embodiment has performed the ion implantation through the protective insulating film 13 with a thickness of about 20 nm and the remaining film 15a with a thickness of about 5 nm, thereby more positively preventing the contaminant from entering the semiconductor substrate 11.

The wells provided in the logic circuit portion 2A are not limited to the second P-well 18 and the N-well 19. It is also possible to form another P-well or another N-well having an impurity concentration profile different from those of the wells 18 and 19 in the other region of the memory circuit portion 2A. An element formed on the first P-well 14 in the memory circuit portion 1A is not limited to the memory element. A transistor may also be formed thereon.

After the step of forming the first P-well 14 shown in FIG. 6A, a deep N-well may also be formed by using the first resist pattern 51, similarly to the variation of the first embodiment. In this case, the respective positions of the second P-well 18 and the N-well 19 in the logic circuit portion 2A are switched preferably.

Although each of the first embodiment, the variation thereof, and the second embodiment has performed a single step of ion implantation during the formation of each of the well regions, each of the well regions may also be formed by performing plural steps of ion implantation with different acceleration energies such that an impurity concentration in each of the well regions is optimized.

What is claimed is:

1. A method for forming a nonvolatile semiconductor device, the method comprising:
    a first step of selectively forming a first well region of a first conductivity type in a memory circuit portion of a semiconductor substrate having the memory circuit portion and a logic circuit portion;
    a second step of successively forming a first insulating film and a first conductor film over the memory circuit portion and the logic circuit portion of the semiconductor substrate;
    a third step of patterning the first insulating film and the first conductor film so as to leave respective regions of the first insulating film and the first conductor film contained in the memory circuit portion;
    a fourth step of selectively forming a second well region of the first conductivity type in the logic circuit portion of the semiconductor substrate;
    a fifth step of successively forming a second insulating film and a second conductor film over the first conductor film in the memory circuit portion and the second well region in the logic circuit portion;
    a sixth step of successively patterning the second conductor film, the second insulating film, the first conductor film, and the first insulating film contained in the memory circuit portion to form a control gate electrode from the second conductor film, form a capacitance insulating film from the second insulating film, form a floating gate electrode from the first conductor film, and form a tunnel insulating film from the first insulating film; and
    a seventh step of patterning respective regions of the second conductor film and the second insulating film contained in the logic circuit portion to form a gate electrode from the second conductor film and form a gate insulating film from the second insulating film.

2. The method of claim 1, wherein
    the third step includes etching a region of the first insulating film contained in the logic circuit portion such that a lower portion thereof is left to cover the logic circuit portion and thereby forming a partial film composed of the first insulating film and
    the fourth step includes implanting ions into the logic circuit portion through the partial film.

3. The method of claim 1, further comprising, prior to the first step, the step of forming a protective insulating film over the entire surface of the semiconductor substrate, wherein
    the first step includes forming the first well region by implanting ions through the protective insulating film and removing a region of the protective insulating film contained in the memory circuit portion,
    the second step includes forming the first insulating film on the protective insulating film,
    the third step includes performing the patterning so as to leave a region of the protective insulating film contained in the logic circuit portion, and
    the fourth step includes implanting ions into the logic circuit portion through the protective insulating film.

4. The method of claim 3, wherein
    the third step includes etching a region of the first insulating film contained in the logic circuit portion such that a lower portion thereof is left to cover the logic circuit portion and thereby forming a partial film composed of the first insulating film and
    the fourth step includes forming the second well region by implanting ions into the logic circuit portion through the partial film and the protective insulating film.

5. The method of claim 1, wherein the fourth step includes selectively forming a third well region of a second conductivity type in the logic circuit portion of the semiconductor substrate.

6. The method of claim 1, further comprising, between the first and second steps, the step of:
    implanting impurity ions of a second conductivity type into the semiconductor substrate to form a fourth well region of the second conductivity type under the first well region.

7. The method of claim 6, wherein the step of forming the fourth well region includes implanting impurity ions of the first conductivity type and impurity ions of the second conductivity type and
    a projected range of the impurity ions of the second conductivity type is larger than a projected range of the impurity ions of the first conductivity type.

8. The method of claim 1, further comprising, between the second and third steps, the step of:
    forming a third insulating film containing a nitride on the region of the first conductor film contained in the memory circuit portion, the third step includes performing the patterning so as to leave a region of the third insulating film contained in the memory circuit portion, wherein the fifth step includes forming the second insulating film on the third insulating film, and the sixth step includes forming the capacitance insulating film from the second and third insulating films.

9. A method for forming a nonvolatile device, the method comprising:

a first step of selectively forming a first well region of a first conductivity type in a memory circuit portion of a substrate having the memory circuit portion and a logic circuit portion;

a second step of successively forming a first insulating film and a first conductor film over the memory circuit portion of the substrate;

a third step of selectively forming a second well region of the first conductivity type in the logic circuit portion of the substrate;

a fourth step of successively forming a second insulating film and a second conductor film over the first conductor film in the memory circuit portion and the second well region in the logic circuit portion;

a fifth step of successively patterning the second conductor film, the second insulating film, the first conductor film, and the first insulating film contained in the memory circuit portion to form a control gate electrode from the second conductor film, form a capacitance insulating film from the second insulating film, a floating gate electrode from the first conductor film and form a tunnel insulating film from the first insulating film; and a sixth step of patterning the second conductor film and the second insulating film contained in the logic circuit portion to form a gate electrode from the second conductor film and form a gate insulating film from the second insulating film.

10. The method of claim 9, further comprising, prior to the first step, the step of forming a protective insulating film over the entire surface of the substrate, wherein:

the first step includes forming the first well region by implanting ions through the protective insulating film and removing a region of the protective insulating film contained in the memory circuit portion, the second step includes forming the first insulating film on the protective insulating film remaining on the logic circuit portion, and the third step includes implanting ions into the logic circuit portion through the protective insulating film.

11. The method of claim 9, wherein the third step includes selectively forming a third well region of a second conductivity type in the logic circuit portion of the substrate.

12. The method of claim 9, further comprising, between the first and second steps, the step of:

implanting impurity ions of a second conductivity type into the substrate to form a fourth well region of the second conductivity type under the first well region.

13. The method of claim 12, wherein the step of forming the fourth well region includes implanting impurity ions of the first conductivity type and impurity ions of the second conductivity type, and a projected range of the impurity ions of the second conductivity type is larger than a projected range of the impurity ions of the first conductivity type.

14. The method of claim 9, further comprising, between the second and third steps, the step of:

forming a third insulating film containing a nitride on the region of the first conductor film contained in the memory circuit portion, wherein:

the fourth step includes forming the second insulating film on the third insulating film, and the fifth step includes forming the capacitance insulating film from the second and third insulating films.

* * * * *